United States Patent [19]

Beery et al.

[11] Patent Number: 4,835,698

[45] Date of Patent: May 30, 1989

[54] SHEET FEEDER SYNCHRONIZATION SYSTEM HAVING ERROR CORRECTION MEANS

[75] Inventors: Jack Beery, Centerville, Ohio; Matthew M. Mikolajczak, Novi, Mich.

[73] Assignee: The Mead Corporation, Dayton, Ohio

[21] Appl. No.: 70,842

[22] Filed: Jul. 7, 1987

[51] Int. Cl.⁴ .................. G06F 15/46; G01B 7/04; B65H 23/18

[52] U.S. Cl. ................... 364/469; 242/186; 364/562

[58] Field of Search .......... 364/469, 478, 559, 560, 364/562; 101/225, 227; 226/2, 40, 45; 156/172, 179; 242/57, 58.1, 186, 190; 355/145 H, 1 L; 377/17, 18

[56] References Cited

U.S. PATENT DOCUMENTS

| | | | |
|---|---|---|---|
| 3,606,117 | 9/1971 | Fagan et al. | 226/2 |
| 3,713,571 | 1/1973 | Simonton | 226/2 |
| 4,143,566 | 3/1979 | Laciak et al. | 226/2 |
| 4,316,566 | 2/1982 | Arleth et al. | 226/2 |

Primary Examiner—Felix D. Gruber
Attorney, Agent, or Firm—Thomas A. Boshinski

[57] ABSTRACT

A method and corresponding apparatus for identifying a series of lengths along a moving web are disclosed, especially for use in registering sheets with the web. The method is used with a device operating on the web including an element rotating synchronously with advance of the web. The method includes generating a data signal in response to rotation of the element, the signal including a series of pulses, with each pulse corresponding to an increment of rotation. A first of the lengths is converted to a first real number of increments, which number is adjusted to a first integer number of increments. The error is retained. A first length is then identified as corresponding to the first integer number of increments within the data signal. A second length is then converted to a second real number of increments. This value is adjusted to an integer number, and the cumulative error is used to correct the value if necessary. The second length is identified along the web as corresponding to the second integer number of increments within the data signal.

33 Claims, 4 Drawing Sheets

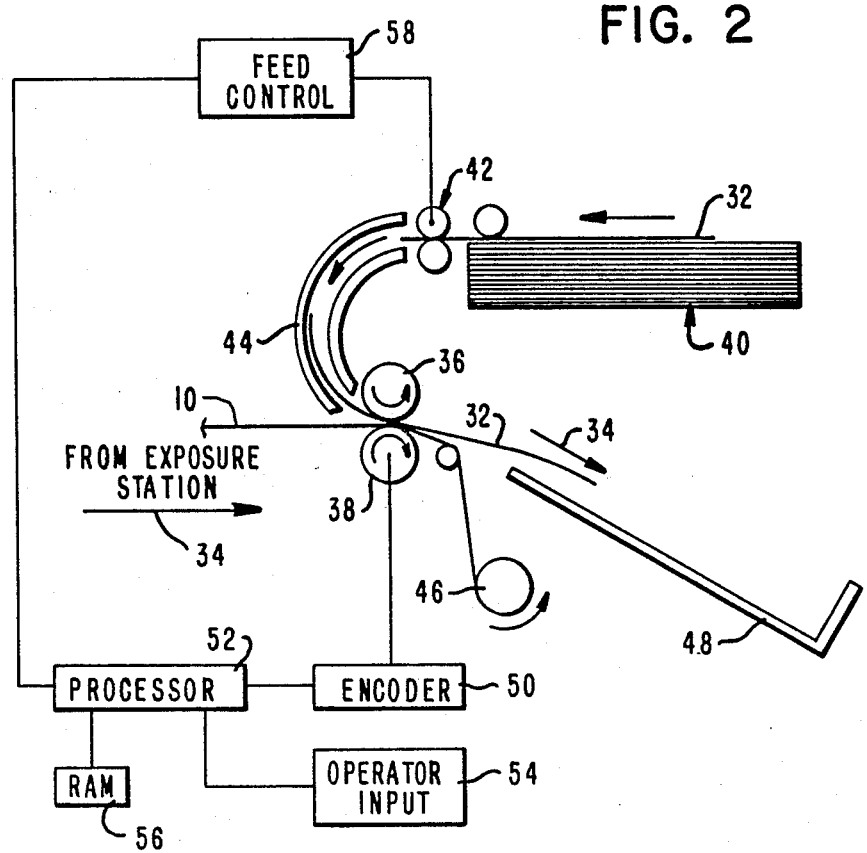

SHEET FEEDER SYNCHRONIZATION SYSTEM HAVING ERROR CORRECTION MEANS

BACKGROUND OF THE INVENTION

The present invention relates generally to web and sheet handling apparatus, and more particularly, to such apparatus in which synchronization of web and or sheet movement is required. The invention enables a rotational encoder having sufficient accuracy for single web operations to be used with similar accuracy over a long run of similar operations.

A number of web-handling devices are known in which proper registration of the web with another web, with sheets, or with the device itself is required. The exact function of these devices depends upon the nature of the web material which is to be handled, as well as the particular operation to be carried out.

One type of web material is disclosed in U.S. Pat. Nos. 4,440,846 and 4,399,209, which describe an imaging media for use with an imaging system. In the media, a photosensitive layer is formed comprising microcapsules containing a photosensitive composition in the internal phase. The photosensitive layer is image-wise exposed to actinic radiation and subjected to a uniform rupturing force whereupon the microcapsules rupture and image-wise release the internal phase. An image-forming chromogenic material, such a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the nip between a pair of parallel calender rolls.

This photosensitive media may exist in a form which comprises two sheet-like layers. The microcapsules are carried on a first substrate layer, which layer is most conveniently provided in the form of a continuous web referred to as a donor web. The developer composition is coated onto a second, separate substrate layer, typically formed as separate sheets, with each sheet referred to as a receiver sheet. The donor web is subjected to the actinic radiation, and the exposed microcapsule layer is then brought into contact with the developer layer of the receiver sheets. The sheet and web are developed by pressure, with the finished image being formed in the receiver sheet.

It will be readily recognized that when the receiver sheet is brought into contact with the donor web, the receiver sheet must be accurately registered with the web, otherwise the finished image will be offset on the sheet. Once the donor web has been exposed to actinic radiation, the location of the image on the web has been fixed. Thus, the receiver sheet must be properly positioned with respect to the web in order to correspond to the exposed image.

A variety of registration systems are known for devices which operate on moving webs. In general, for such registration systems to operate properly, accurate data concerning the positioning of the web must be available. For example, in the case of the photosensitive media described above, both the positioning of the exposed portion of the web with respect to the web, and the overall positioning of the web with respect to the apparatus must be known in order for the sheet to be brought properly into position.

One common means for monitoring the positioning of a moving web with respect to a rotating member is to connect a rotary positional encoder to the rotating member. In the case of apparatus operating on the microencapsulated photosensitive media, such a member could be, for example, one of the pressure rolls used to develop the donor web and receiver sheets to produce finished images. Encoders for such use are well known, available with varying degrees of accuracy. As might be expected, the degree of accuracy of the encoder is typically closely related to the cost of the encoder.

In selecting an appropriate encoder for use in registering operations on a moving web, encoder accuracy must be considered from two standpoints. First, the encoder must have sufficient accuracy for a single given operational step, and second, it must have sufficient accuracy over a long series of operations. Many commercially available encoders can provide a necessary single-step accuracy for even precise applications. For example, for the microencapsulated photosensitive media, any encoder accuracy better than 0.004" provides the necessary single-step accuracy in registering the receiver sheet to the donor web. Such encoders are available at reasonable cost. However, over a long run, this accuracy is not sufficient. In the course of incrementing the imaging system for the media five times to produce five images, cumulative error of as much as 0.020" could occur. Such amount of error may produce unsatisfactory results.

What is needed, therefore, is a means for precisely identifying a series of predetermined lengths along a web in successive fashion. Such means should operate so that lengths are determined as a function of the rotation of an element operating on the moving web. Such means should be capable of providing an accuracy sufficient for registering operations on the web, particularly where the web represents a donor material to which a receiver sheet must be registered. Further, despite the capability for sufficient accuracy over a long run, the length determining means should be of a reasonable cost and complexity.

SUMMARY OF THE INVENTION

The present invention meets the foregoing needs by proving a method for identifying a series of predetermined lengths along a moving web. The method is for use with an apparatus operating on the web that includes an element rotating synchronously with advance of the web.

The method includes generating a data signal in response to rotation of the rotating element, the data signal including a series of count pulses, with each pulse corresponding to a predetermined increment of rotation. A first of the predetermined lengths is converted to a first real number of the increments. This first real number is adjusted to an adjacent first integer number of the increments, and a first error amount resulting from the adjusting is determined. The apparatus is operated to generate the data signal, and a first of the lengths is identified along the web as corresponding to the first integer number of increments within the data signal.

Next, a second of the predetermined lengths is converted to a second real number of increments. The second real number is then adjusted to an adjacent second integer number of increments. A second error amount resulting from the adjusting is determined. The first error amount is added to the second error amount to produce a cumulative error amount. If this cumulative amount exceeds one, the second integer number is incremented to a corrected second integer number, and the cumulative error is decreased by one. A second of the lengths is identified along the web as corresponding to the second integer number of increments within the data signal.

In similar fashion, each subsequent one of the predetermined lengths is converted to a real number of increments, which is in turn adjusted to an integer number of increments. The error amount is added to the cumulative error. If this cumulative amount exceeds one, the second integer number is incremented to a corrected second integer number, and the cumulative error is decreased by one. The next length is identified along the web as corresponding to the integer number of increments within the data signal.

The adjusting of each real number of increments to an adjacent integer number of increments is preferably carried out by truncating the real number to the adjacent integer number. The residue portion following such truncation becomes the error amount. As an alternative, adjustment of the real number may be performed by rounding the real number to the closest of the two adjacent integer numbers to the real number. Of course, in this case, the error amount may be positive or negative, depending upon the direction in which rounding occurs.

In accordance with an alternative embodiment of the invention, once the first length has been identified along the web by the method described, a second of the predetermined lengths is converted to a second real number of increments. The first error amount which has been retained is added to the second real number to produce a second corrected real number of increments. The second corrected real number is then adjusted to a second integer number of increments. A second error amount resulting from the adjusting is determined, and a second of the lengths is identified along the web as corresponding to the second integer number of increments within the data signal.

More specifically, the present invention provides a method for positioning sheets fed from a sheet supply onto a moving web in registration with predetermined nominal lengths along the web. The method is for use with an apparatus operating on the web, including an element rotating synchronously with advance of the web. The method includes the steps outlined above. In addition, following the identifying of the first of the nominal lengths along the web, a sheet is fed onto the web such that a leading edge of the sheet aligns with the first length as identified along the web. After a second of the nominal lengths is identified along the web, another sheet is fed onto the web such that a leading edge of the sheet aligns with said second length as identified along the web.

Similarly, subsequent sheets are fed onto the web such that a leading edge of each sheet aligns with each subsequent length as identified along the web.

In either case, the data signal may be generated by a rotational positional encoder connected for rotation to the element, whereby each of the pulses corresponds to an incremental advance of the web. The encoder may therefore be selected to define an increment of rotation corresponding to web movement of an incremental length of less precision than the precision of the predetermined lengths.

In the methods, at least some of the predetermined lengths may be different. Alternatively, each of the predetermined lengths may be identical.

Following feeding of a known number of sheets onto the web, the method of positioning sheets may include measuring an actual error value between actual feeding location of the last of the sheets onto the web and a predetermined feeding location. The actual error value is divided by the known number of sheets to produce a per sheet error value. This per sheet error value is then added to all further predetermined nominal lengths along the web.

The present invention also provides apparatus for identifying a series of predetermined lengths along a moving web, for use with a device operating on the web that includes an element rotating synchronously with advance of the web. The apparatus includes means for generating a data signal in response to rotation of the element, the data signal including a series of count pulses, with each pulse corresponding to a predetermined increment of rotation.

The apparatus includes means for storing data. Processing means connected to the data signal generating means and to the data storing means converts a first of the predetermined lengths to a first real number of increments. The processing means next adjusts the first real number to an adjacent first integer number of increments, determines a first error amount resulting from the adjusting, and stores the first error amount in the data storing means. The processing means further receives the data signal such that upon operating the device to generate the data signal, a first of the lengths is identified along the web as corresponding to the first integer number of increments within the data signal.

The processing means further converts a second of the predetermined lengths to a second real number of increments, which real number is adjusted to an adjacent second integer number of increments. A second error amount resulting from this adjusting is determined. The processing means next adds the second error amount to the first error amount to produce a cumulative error amount. If this cumulative amount exceeds one, the processing means increments the second integer number to a corrected second integer number, and decreases the cumulative error by one. The processing means also continues to receive the data signal such that upon further operating of the device to generate the data signal, a second of the lengths is identified along the web as corresponding to the second integer number of increments within the data signal.

In an alternative embodiment, after the first length has been identified along the web, the processing means converts the second of the predetermined lengths to a second real number of increments. Retrieved from the data storing means and added to the second real number is the first error amount, producing a second corrected real number of increments. The processing means adjusts this second corrected real number to an adjacent second integer number of increments, determines a second error amount resulting from the adjusting, and stores the second error amount in the data storing means. The processing means then continues to receive the data signal such that upon further operating of the device to generate the data signal, a second of the lengths is identified along the web as corresponding to the second integer number of increments within the data signal.

Considered differently, the present invention provides apparatus for positioning sheets fed from a sheet supply onto a moving web in registration with predetermined nominal lengths along the web. The apparatus is for use with a device operating on the web, including an element rotating synchronously with advance of the web. The apparatus includes the elements described above. In addition, the apparatus includes feed means for feeding a sheet onto the web. The feed means is under control of the processing means such that a leading edge of a first sheet aligns with the first length as it is identified along the web. Similarly, a second sheet is fed onto the web in response to the processing means such that a leading edge of the sheet aligns with the second length as identified along the web.

Similarly, subsequent sheets are fed onto the web such that a leading edge of each sheet aligns with each subsequent length as identified along the web.

The data signal generating means may be a rotational positional encoder connected for rotation to the element, whereby each of the pulses corresponds to an incremental advance of the web. The encoder may therefore be selected to define an increment of rotation corresponding to web movement of an incremental length of less precision than the precision of the predetermined lengths.

The apparatus may also include operator input means whereby the processing means may be provided by an operator with the predetermined lengths along the web.

Accordingly, it is an object of the present invention to provide a method and apparatus for precisely identifying a series of predetermined lengths along a web in successive fashion; to provide such a method and apparatus wherein lengths are determined as a function of the rotation of an element rotating with the moving web; to provide such a method and apparatus that is capable of providing an accuracy sufficient for registering operations on the web; to provide such a method and apparatus specifically adapted for registering single sheets with the lengths defined on the web; and to provide such a method and apparatus which is especially useful with a web comprising a donor material to which a receiver sheet must be registered.

Other objects and advantages of the invention will be apparent from the following description, the accompanying drawings and the appended claims.

BRIEF DESCRIPTION OF THE DRAWINGS

FIG. 2 is a schematic diagram of an apparatus in accordance with the present invention for identifying lengths along a moving web and registering sheets thereto;

DETAILED DESCRIPTION OF THE PREFERRED EMBODIMENT

The method and apparatus of the present invention for identifying a series of predetermined lengths along a web in successive fashion is preferably used in conjunction with a photosensitive imaging media described in U.S. Pat. Nos. 4,440,846, and 4,399,209, which are hereby incorporated by reference. Such media can be seen by reference to FIGS. 1A-1C, wherein an imaging web 10 is constituted by a substrate 12 coated with a layer of microcapsules 14. The microcapsules 14 are filled with an internal phase 16 containing a photosensitive composition. Usually, the microcapsules 14 also contain chromogenic material; however, chromogenic material can be associated with the microcapsules 14 in other ways, such as by incorporation into the microcapsule wall or in a layer contiguous with the microcapsules.

Figure 1A:
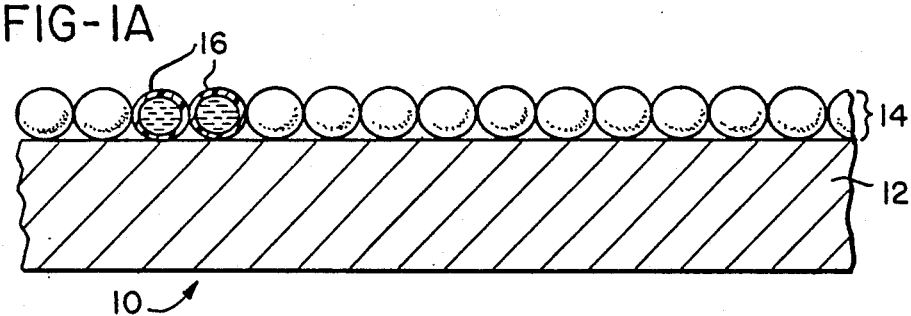
FIGS. 1A-1C are schematic illustrations in cross-section of an imaging web and receiver sheet for which the present invention is especially adapted, illustrating the imaging web, exposure of the web, and development of the image in the receiver sheet.

While shown in FIG. 1A, in actuality, the microcapsules 14 are not visible to the unaided eye, since the mean size of the microcapsules generally ranges from approximately 1-25 microns.

Figure 1B:
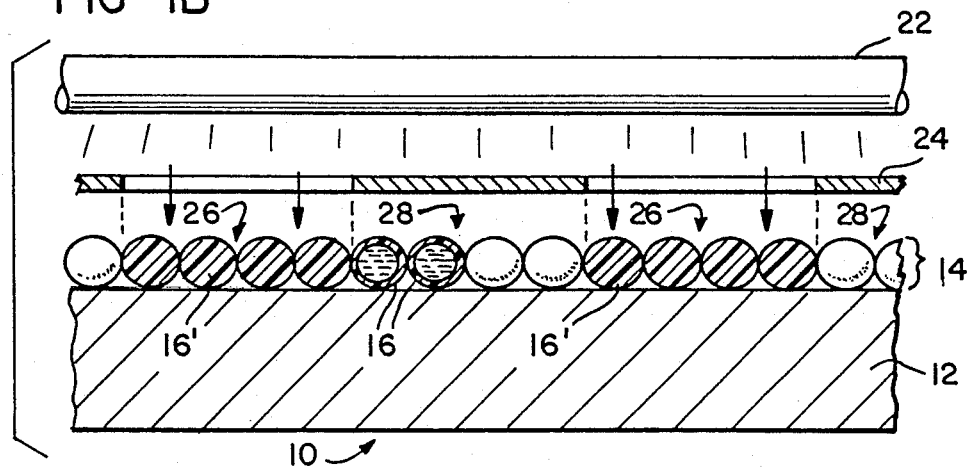

Exposure of the imaging web 10 by transmission imaging is shown in FIG. 1B. A source of radiant energy 22 is positioned above the surface of the imaging web 10 with a mask 24 positioned therebetween. As illustrated, the substrate 12 is opaque and the photosensitive material within the microcapsules 14 is a positive working radiation curable material, i.e., the viscosity of the material increases upon exposure to actinic radiation.

The radiation of the exposed areas 26 causes the radiation curable composition in the internal phase 16 of the microcapsules 14 to polymerize, thereby gelling, solidifying or otherwise immobilizing the chromogenic material and preventing the chromogenic material from reacting with the developer material 20. To simplify the illustration, internal phase 16' in the exposed areas 26 is shown as a solid, whereas the internal phase 16 remains liquid in the unexposed areas 28.

The imaging web 10 is next processed by subjecting the imaging web to a uniform rupturing force by means of a pair of pressure rollers in resilient pressure engagement with the imaging web along a nip. The imaging web is moved between the rollers such that the rollers supply a uniform force to substantially the entire width of the imaging web to rupture the microcapsules 14 such that the chromogenic material contained within the microcapsules 14 or otherwise associated therewith can interact with the developer material 20.

Figure 1C:
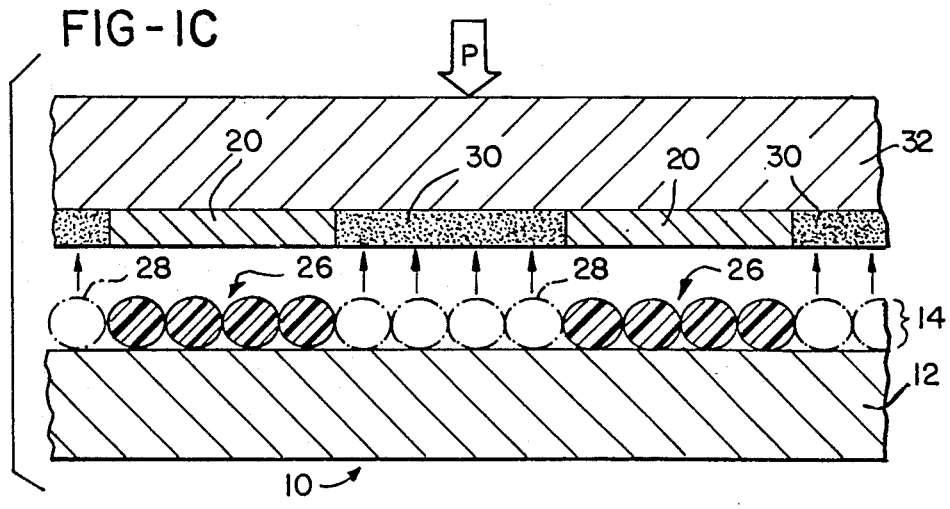

As shown in FIG. 1C, the necessary developer material 20 is formed as a layer of developer material on a separate substrate or receiver sheet 32. The receiver sheet 32 is aligned and in facing engagement with the transfer imaging web 10. As the uniform rupturing force is applied by the pressure rollers to the combination of the transfer imaging web 10 and the receiver sheet 32, the microcapsules 14 are ruptured and the internal phase migrates to the developer layer 20 of the receiver sheet 32, where it reacts with the developer material to form the image 30.

The portion of the imaging system apparatus at which developing of the image can be carried out can be seen schematically in FIG. 2. (The exposure portion of the apparatus is not relevant to the operation of the present invention and not necessary to an understanding of the invention, and is therefore not shown.)

The imaging web 10 approaches the developer station from the exposure station (not shown), where the web 10 was subjected to actinic radiation in accordance with the method described above. Web 10 proceeds generally in a direction indicated by arrow 34, and passes between a pair of parallel developer rolls 36 and 38 which define a pressure nip therebetween. Rolls 36 and 38 are counter-rotated to draw web 10 therebetween, and are specifically constructed to provide a uniform pressure across the entire length of the nip. Further details regarding rolls 36 and 38 can be seen by reference to copending U.S. patent application Ser. No. 039,393 filed Apr. 16, 1987 now U.S. Pat. No. 4,768,050.

A supply of receiver sheets 32 is held within a storage bin 40, with single sheets being drawn therefrom by an appropriate sheet feed means 42. Feed means 42 can be any conventional feed means capable of withdrawing a single developer sheet from the supply upon appropriate control instructions, and feeds the sheet into an appropriate guide 44 which directs the sheet to the entrance to the nip between pressure rollers 36 and 38. Assuming the feed means 42 has withdrawn a developer sheet 32 from the supply at the appropriate time, sheet 32 will be delivered to the nip between pressure rollers 36 and 38 in proper registration with an exposed portion of imaging web 10. The sheet and web then pass through the nip in superimposed condition, whereupon the microcapsules on the imaging web 10 are ruptured, with the result that the finished image is formed in the receiver sheet 32. Upon emerging from pressure rollers 36 and 38, the used imaging web 10 is collected on a supply roll 46, while the receiver sheet 32 may be directed into an appropriate output bin 48.

Rotationally coupled to pressure roller 38 is a position encoder 50 which may be of any appropriate type for providing a data output signal which is a function of increments of rotation of roller 38. Preferably, encoder 50 is an optical encoder. The encoder must be capable of the necessary accuracy for a single step operation for production of a single image. In one working example, an accuracy of 0.004" has been found to be sufficient. For a typical pressure roll diameter of approximately 2.0", encoder 50 can achieve such accuracy with a resolution of 1,600 increments per revolution.

Output from encoder 50 is directed to a processor 52, which may be any commercially available microprocessor. As will be recognized from the following description, the computational requirements of the present invention are not particularly great, and it will therefore be apparent that a wide variety of processors are appropriate for use with the present invention. Moreover, processor 52 need not be dedicated to the length determination system described herein, but could also be adapted to carry out other functions in connection with the total web processing system.

Processor 52 receives additional input from an operator input means 54, which may also be conventional. Such input means will require an appropriate device for enabling the operator to provide processor 52 with a length value or values along the web which the encoder 50 is to measure. One such means by which such values may be entered is a numeric keypad. Further, it will be recognized that it is not necessary that such data be manually entered. For example, the data could be withdrawn from an appropriate memory device, could be automatically measured and entered by some other device, or could be handled in a variety of other manners.

Also connected to processor 52 is a random access memory 56. As will be recognized from the following description, it is necessary for processor 52 to store and retrieve certain values during the operation of the system. As with processor 52, the space demands made upon memory 56 by the present invention are relatively small, and therefore a relatively low capacity memory can be used. Alternatively, memory 56 can simply be a portion of a larger memory used for other storage operations in connection with other web-operating processes.

Receiving output from processor 52 is an appropriate feed control means 58. Feed control means 58 is in turn connected to the receiver sheet feed means 42. Feed control means 58 may be any appropriate control means for use with the particular feed means 42 selected. To understand the present invention, it is sufficient to note that processor 52 instructs feed control means 58 to cause feed means 42 to supply a receiver sheet 32 to pressure development rolls 36 and 38 in response to certain travel distance of web 10. If feed means 42 is actuated at the proper time, the receiver sheet will be brought into contact with web 10 in proper registration.

Figure 3:
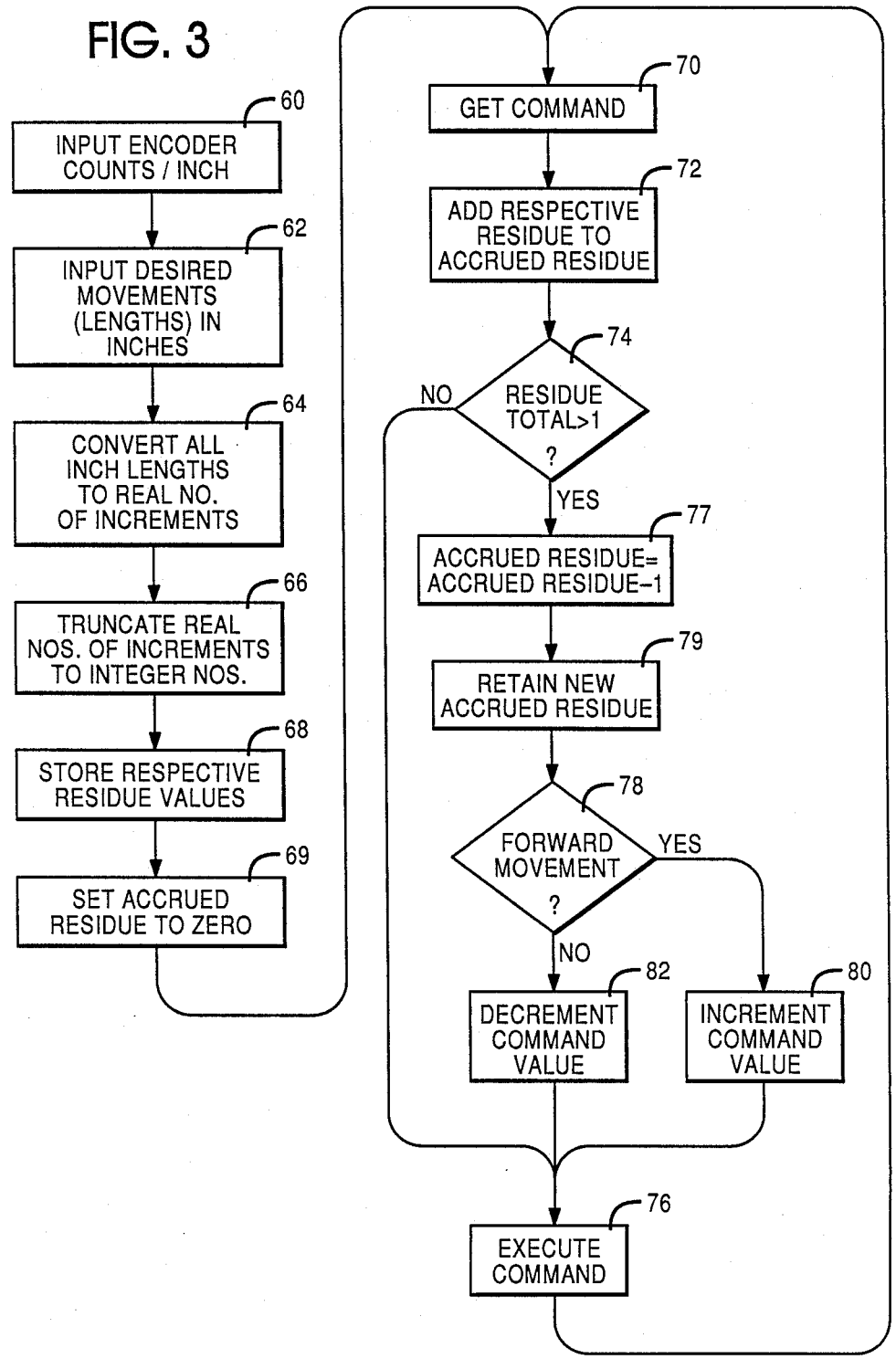
FIG. 3 is a flowchart diagram illustrating the method for identifying lengths along the web.

The operation of processor 52 in accordance with a preferred embodiment of the present invention to enable encoder 50 to operate with a high degree of accuracy over a long run can be seen by reference to the diagram of FIG. 3. Initially, at block 60, the number of encoder counts per inch of web movement is entered by the operator through a keyboard or other approriate input means 54. This number can be determined, for example, empirically by operating the system over a known length to obtain an encoder count. Alternatively, some automated measuring system can also be used. While a theoretical number can be determined, the distance corresponding to a single increment is sufficiently small that system tolerances will result in an actual number which differs from theoretical.

Next, at block 62, the operator enters the desired length(s) of web travel between successive receiver sheets through the operator input means 54 or other appropriate means. To provide an accuracy of, for example, 0.004", such input value should include five decimal places. Since a typical receiver sheet with which the imaging system is to be used will have a length in the order of 11.0", for example, it will be necessary for this input value to have seven significant digits. All possible lengths which will be used during the course of system operations, and the number of and order in which such lengths will be encountered, are entered. In many operations, however, a single length will be used, although multiple operations at this length will be performed.

Each inch length to be measured along the web is converted, shown at block 64, to a real number of encoder increments. Because the input value has a greater degree of accuracy than the encoder increments, this conversion may result in a non-integer number of increments. Each of these resulting real numbers of increments is then adjusted to an adjacent integer number of increments. Preferably, as shown at block 66, adjusting is carried out by truncating the real number to an integer number, in which case adjustment is always in a downward direction. Such a method is preferred since it eases the computational requirements of the system when compared with rounding the real number to an integer. For a typical increment corresponding to a length in the order of 0.004", any loss in accuracy for a single document resulting from truncation rather than rounding will be insignificant. However, it should also be recognized that the present invention may be carried out using rounding of the real increment numbers to integer values.

The respective residue values resulting from each truncation are stored at block 68. An accrued residue value to be used in the run mode is set to 0 block 69.

The foregoing calculations are performed prior to the beginning of operations on the web, at which time the system is in a standby mode. During such time, particularly as operator input is made, relatively long periods of time are available for such calculations. However, such calculations could also be performed during running operations of the system as the respective values are needed. The time required to perform such calculations could, however, slow system operations, particularly if a relatively small processor is used.

One important feature of the present system is the ability to operate with the web moving in a reverse direction. This is important, since some deadband may exist along the web between the exposure station and the developer station (see FIG. 2), particularly after the web is first installed. Reverse operations enable this otherwise wasted portion of the web to be used.

As movements data are entered at block 62, any reverse movements are designated as such, with such information being retained in memory by a negative sign, a data flag or the like. Because computational time is important once the system is in a run mode, it is advantageous for all residue operations to be additive. Thus, in the case of reverse movements, the stored residue is calculated as (1 − Actual Residue). Of course, it would be possible to store negative residue values for reverse movement at a loss of some computational efficiency.

The system next enters the run mode. The initial movement command is retrieved from memory, block 70, and the corresponding residue value is added to the accrued residue value, at block 72. Of course, upon start-up, such accrued value will initially be zero. At block 74, the accrued value is tested to determine whether the value exceeds one. In the case of the first movement of a run, the accrued value will neccessarily be less than one, and the program moves to block 76, where the movement command is carried out.

The web is operated on in accordance with the integer number of increments corresponding to the desired movement. Since the encoder has been selected to have an accuracy sufficient for a single operation on the web, such operation will be performed within the necessary accuracy. In the case of the specific embodiment described herein, the imaging web will be advanced by the necessary length (within an accuracy of 0.004"), and a receiver sheet will be fed onto the web in proper registration to produce a properly located image on the receiver sheet.

Following advancement of the web and feeding of the receiver sheet, the processor retrieves the next command, again at block 70. In most cases, this next movement will be identical to the preceding movement, but can be some other value in accordance with the instructions originally input. The respective residue value is added to the accrued value at block 72. Depending upon the magnitude of the residue value, it is now possible that the accrued value may exceed one when tested at block 74. If so, the accrued residue value is decremented by one at block 77, the new accrued value is retained at block 79 and an inquiry is made at block 78 as to whether web operation is in a forward direction. If so, the integer number of encoder counts for the present movement is incremented by one, shown at block 80. The system then executes the movement command at block 76.

If web movement is to be in a reverse direction, the integer number of encoder counts for the present movement must be decremented by one, at block 82. Again, the accrued residue value is decremented by one. The system then executes the movement command at block 76.

This series of operations continues until the desired number of images has been produced.

The operation of the present invention can be better understood, and its effectiveness better appreciated, by reference to the examples shown in Tables I and II. In the example shown in Table I, a single desired length in inches between sheet registrations is defined as 12.06920". The operation is carried out using an encoder having an accuracy of 0.004". As a result of truncating the input inch value to an integer number of increments, a residue corresponding to 0.00120" for each operation is introduced. This is within the error tolerance on a per operation basis, but can accumulate over a series of operations to an excessive amount. In this regard, Table I should be compared with Table II, in which the same encoder is used without the error correction system incorporated into the present invention. It can be seen in Table II that by the fourth operation, the cumulative error exceeds that amount which has been defined as acceptable. As the operation further proceeds, the cumulative error continues to grow. By the seventh operation, cumulative error is more than twice the acceptable level. On the other hand, as shown in Table I, the system of the present invention results in a cumulative error which at no time exceeds the acceptable error.

TABLE I

| | | Error Correcting System | | | | |
|---|---|---|---|---|---|---|
| Step | Inch Command | Effective Step Command | Actual Step Command | Response (Inch) | Cumulative Residue (Step) | Cumulative Error (Inch) |
| 1 | 12.06920 | 3017.300 | 3017 | 12.068 | .300 | .00120 |
| 2 | 12.06920 | 3017.300 | 3017 | 12.068 | .600 | .00240 |
| 3 | 12.06920 | 3017.300 | 3017 | 12.068 | .900 | .00360 |
| 4 | 12.06920 | 3017.300 | 3018 | 12.072 | .200 | .00080 |
| 5 | 12.06920 | 3017.300 | 3017 | 12.068 | .500 | .00200 |
| 6 | 12.06920 | 3017.300 | 3017 | 12.068 | .800 | .00320 |
| 7 | 12.06920 | 3017.300 | 3018 | 12.072 | .100 | .00040 |

TABLE II

| | | Normal System--No Error Correction | | | | |
|---|---|---|---|---|---|---|
| Step | Inch Command | Effective Step Command | Corrected Step Command | Response (Inch) | Cumulative Residue (Step) | Cumulative Error (Inch) |
| 1 | 12.06920 | 3017.300 | 3017 | 12.068 | .300 | .00120 |
| 2 | 12.06920 | 3017.300 | 3017 | 12.068 | .600 | .00240 |
| 3 | 12.06920 | 3017.300 | 3017 | 12.068 | .900 | .00360 |
| 4 | 12.06920 | 3017.300 | 3017 | 12.068 | 1.200 | .00480 |
| 5 | 12.06920 | 3017.300 | 3017 | 12.068 | 1.500 | .00600 |
| 6 | 12.06920 | 3017.300 | 3017 | 12.068 | 1.800 | .00720 |
| 7 | 12.06920 | 3017.300 | 3017 | 12.068 | 2.100 | .00840 |

Figure 4:
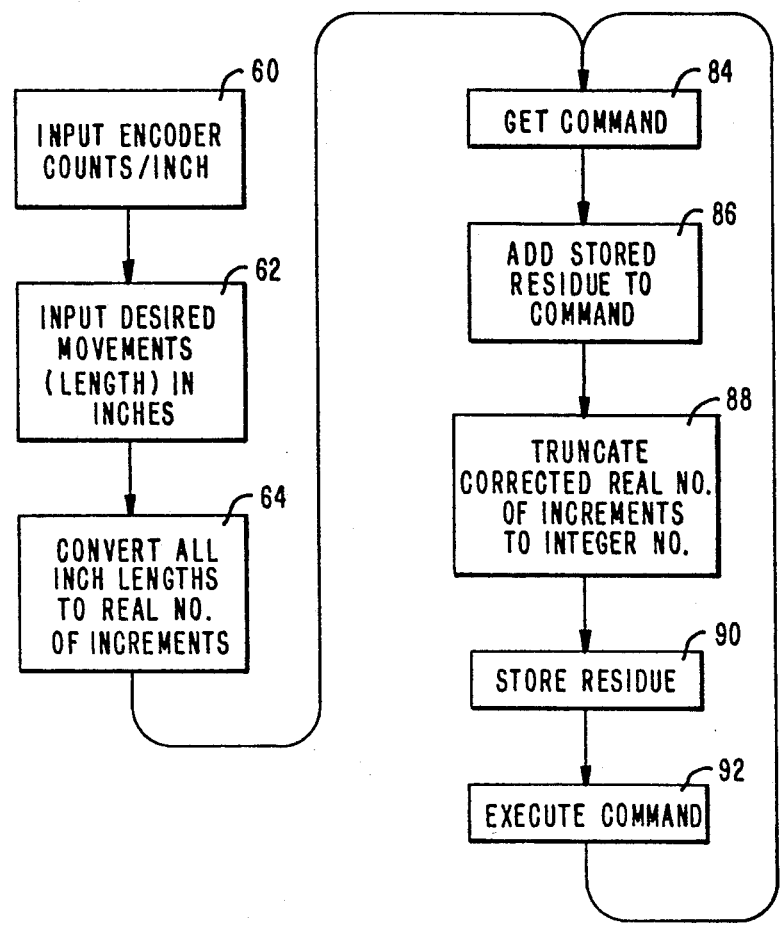
FIG. 4 is a flowchart diagram illustrating an alternative method for identifying lengths along the web.

An alternative embodiment of the method of the present invention may be seen by reference to FIG. 4. In this case, encoder counts per inch and desired movements in inches are initially entered at blocks 60 and 62. Similar to the preferred method previously described, each of the entered movements is converted at block 64 to a real number of increments. However, rather than truncating the integer values prior to entry of the system into a run mode, the embodiment of FIG. 4 next enters the run mode, where the first movement command is obtained at block 84.

Any stored residue from previous truncation is added to the retrieved command at block 86. For the initial movement, this stored residue should be zero. The corrected real number of increments is then truncated at block 88 to the adjacent integer number. (Of course, it will be recognized that as a further alternative, rounding of the real number to the integer number may be used instead of truncation.) The resulting residue from truncation is stored at block 90. The integer number of increments is used as the command for execution at block 92.

The program returns to block 84, where the next command is retrieved. The stored residue is added to the real number command, and it can be seen that if the stored residue and the decimal portion of the command are sufficiently large, the whole number portion of the command will be affected. Thus, when truncation occurs at block 88, the resulting integer number of increments may differ from that of the preceding movement (assuming the original commands were identical). The new residue is stored at block 90, and the command is executed at block 92.

The present invention may also be provided with an error entry means whereby measured error may be used to correct further registration operations. It can be seen that accurate registration with the system described herein is dependent upon accurate entry of the web lengths in the first instance. However, the system operator may have only approximate lengths for the individual images to be formed on the web.

Where the apparatus is used to produce a relatively long series of identical measurements, the system may be configured to initially produce a series of images. As one example, fifty images may be produced. The last such image is reviewed to determine what, if any, registration error has resulted from the fifty operations of the apparatus. This amount is input into the processor 52 through the operator input means 54, as is the number of increments over which the registration error was generated. The processor then operates to divide the total error by the number of documents, and adjusts the document length by the resulting per document amount.

As an example, assume that after production of fifty images, each having a nominal length of 12.06920", a registration error of +0.023" is measured. This amount, together with the fifty document count, is input to processor 52. The average per document error is then +0.0046", which amount is subtracted from the stored nominal document length to produce a new length of 12.06460". In this manner, the system is corrected for errors introduced during operations.

It should be recognized that the invention described herein is not limited to use with a sheet feeding, registration, or pressure development system. Further, the invention is not confined to use with the photosensitive imaging media described herein. Rather, the invention is applicable to any device for operating upon a moving web having a rotational member to which an encoder may be connected. Other appropriate uses for the present invention will be readily recognized by those skilled in the art.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. A method for measuring a series of predetermined lengths along a web moving past a stationary location to enable registered positioning of at least one repetitive operation on the web in accordance with said predetermined lengths, the method comprising the steps of:

generating a data signal in response to rotation of an element synchronously with any advance of the web past said stationary location, said data signal including a series of count pulses, each of said pulses corresponding to identical increments of rotation;

converting a first of said predetermined lengths to a first real number of said increments;

adjusting said first real number to an adjacent first integer number of said increments;

determining a first error amount resulting from said adjusting;

defining a first of said lengths along the web as corresponding to advance of the web past said stationary location sufficient to cause generation of said signal so as to include said first integer number of said count pulses within said data signal;

converting a second of said predetermined lengths to a second real number of said increments;

adjusting said second real number to an adjacent second integer number of said increments;

determining a second error amount resulting from said adjusting;

adding said second error amount to said first error amount to produce a cumulative error amount;

in the event said cumulative error exceeds one, incrementing said second integer number to an adjacent corrected second integer number and decreasing said cumulative error amount by one; and defining a second of said lengths along the web as corresponding to further advance of the web past said stationary location sufficient to cause generation of said signal so as to include said corrected second integer number of said count pulses within said data signal.

2. The method as defined in claim 1, wherein said adjusting is performed by truncating said first real number and said second corrected real number to said first integer number and said second integer number, respectively, and wherein said first and second error amounts are residues from said truncating.

3. The method as defined in claim 1, wherein said adjusting is performed by rounding said first real number and said second corrected real number to said first integer number and said second integer number, respectively, and wherein said first and second error amounts result from said rounding.

4. The method as defined in claim 1, wherein said data signal is generated by a rotational positional encoder connected for rotation to said element, whereby each of said pulses corresponds to an incremental advance of the web.

5. The method as defined in claim 4, wherein said encoder defines an increment of rotation corresponding to web movement of an incremental length of less precision than the precision of said predetermined lengths.

6. The method as defined in claim 1, wherein at least some of said predetermined lengths are different.

7. The method as defined in claim 1, wherein each of said predetermined lengths are identical.

8. The method as defined in claim 1, comprising the further steps of:

converting each subsequent one of said predetermined lengths to a subsequent real number of said increments;

adjusting said subsequent real number to a subsequent integer number of said increments;

determining a subsequent error amount resulting from said adjusting;

adding to said cumulative error amount said subsequent error amount;

in the event said cumulative error exceeds one, incrementing said second integer number to an adjacent corrected second integer number and decreasing said cumulative error amount by one; and defining a subsequent one of said lengths along the web as corresponding to said subsequent integer number of said increments within said data signal.

9. A method for measuring a series of predetermined lengths along a web moving past a stationary location to enable registered positioning of at least one repetitive operation on the web in accordance with said predetermined lengths, the method comprising the steps of:

generating a data signal in response to rotation of an element synchronously with any advance of the web past said stationary location, said data signal including a series of count pulses, each of said pulses corresponding to identical increments of rotation;

converting a first of said predetermined lengths to a first real number of said increments;

adjusting said first real number to an adjacent first integer number of said increments;

determining a first error amount resulting from said adjusting;

defining a first of said lengths along the web as corresponding to advance of the web sufficient to cause generation of said signal so as to include said first integer number of said count pulses within said data signal;

converting a second of said predetermined lengths to a second real number of said increments;

adding to said second real number said first error amount to produce a second corrected real number of said increments;

adjusting said second corrected real number to an adjacent second integer number of said increments;

determining a second error amount resulting form said adjusting; and defining a second of said lengths along the web as corresponding to further advance of the web sufficient to cause generation of said signal so as to include said second integer number of said count pulses within said data signal.

10. A method for positioning sheets fed from a sheet supply onto a moving web in registration with predetermined nominal lengths along the web, the method comprising the steps of:

generating a data signal in response to rotation of an element synchronously with any advance of the web past a stationary location said data signal including a series of count pulses, each of said pulses corresponding to identical increments of rotation;

converting a first of said predetermined nominal lengths to a first real number of said increments;

adjusting said first real number to an adjacent first integer number of said increments determining a first error amount resulting from said adjusting;

advancing the web a first distance with respect to said stationary location to generate said data signal so as to include a number of said count pulses equal to said first integer number;

defining a first of said nominal lengths along the web as corresponding to said first distance advance of the web;

feeding a sheet onto the web at said stationary location such that a leading edge of the sheet aligns with said first length as defined along the web;

converting a second of said predetermined nominal lengths to a second real number of said increments;

adjusting said second real number to an adjacent second integer number of said increments;

determining a second error amount resulting from said adjusting;

adding said second error amount to said first error amount to produce a cumulative error amount;

in the event said cumulative error exceeds one, incrementing said second integer number to an adjacent corrected second integer number and decreasing said cumulative error amount by one;

advancing the web a second distance with respect to said stationary location to generate said data signal so as to include a number of said pulses equal to said corrected second integer number;

defining a second of said nominal lengths along the web as corresponding to said second distance advance of the web; and feeding a sheet onto the web at said stationary location such that a leading edge of the sheet aligns with said second lengths as defined along the web.

11. The method as defined in claim 10, wherein said adjusting is performed by truncating said first real number and said second corrected real number to said first integer number and said second integer number, respectively, and wherein said first and second error amounts are residues from said truncating.

12. The method as defined in claim 10, wherein said adjusting is performed by rounding said first real number and said second corrected real number to said first integer number and said second integer number, respectively, and wherein said first and second error amounts result from said rounding.

13. The method as defined in claim 10, wherein said data signal is generated by a rotational positional encoder connected for rotation to said element, whereby each of said pulses corresponds to an incremental advance of the web.

14. The method as defined in claim 13, wherein said encoder defines identical increments of rotation, each corresponding to web movement of an incremental length of less precision than the precision of said predetermined lengths.

15. The method as defined in claim 10, wherein at least some of said predetermined lengths are different.

16. The method as defined in claim 10, wherein each of said predetermined lengths are identical.

17. The method as defined in claim 10, comprising the further steps of:
converting each subsequent one of said predetermined nominal lengths to a subsequent real number of said increments;
adjusting said subsequent real number to a subsequent integer number of said increments;
determining a subsequent error amount resulting from said adjusting;
adding to said cumulative error amount said subsequent error amount;
in the event said cumulative error exceeds one, incrementing said subsequent integer number to an adjacent corrected subsequent integer number and decreasing said cumulative error amount by one;
advancing the web a subsequent distance with respect to said stationary location to generate said data signal so as to include a number of said pulses equal to said corrected subsequent integer number;
defining a subsequent one of said nominal lengths along the web as corresponding to said subsequent distance advance of the web; and
feeding a sheet onto the web at said stationary location such that a leading edge of the sheet aligns with said subsequent length as defined along the web.

18. The method as defined in claim 17, comprising the further steps of:
following feeding of a known number of the sheets onto the web, measuring an actual error value between actual feeding location of the last of the sheets onto the web and a predetermined feeding location;
dividing said actual error value by said known number of sheets to produce a per sheet error value; and
adding said per sheet error value to all further predetermined nominal lengths along the web.

19. A method for positioning sheets fed from a sheet supply onto a moving web in registration with predetermined nominal lengths along the web, the method comprising the steps of:
generating a data signal in response to rotation of an element synchronous with any advance of the web past a stationary location, said data signal including a series of count pulses, each of said pulses corresponding to identical increments of rotation;
converting a first of said predetermined nominal lengths to a first real number of said increments;
adjusting said first real number to an adjacent first integer number of said increments;
determining a first error amount resulting from said adjusting;
advancing the web a first distance with respect to said stationary location to generate said data signal so as to include a number of said count pulses equal to said first integer number;
defining a first of said nominal lengths along the web as corresponding to said first distance advance of the web;
feeding a sheet onto the web at said stationary location such that a leading edge of the sheet aligns with said first length as defined along the web;
converting a second of said predetermined nominal lengths to a second real number of said increments;
adding to said second real number said first error amount to produce a second corrected real number of said increments;
adjusting said second corrected real number to an adjacent second integer number of said increments;
determining a second error amount resulting from said adjusting;
advancing the web a second distance with respect to said stationary location to generate said data signal so as to include a number of said pulses equal to said second integer number;
defining a second of said nominal lengths along the web as corresponding to said second distance advance of the web; and
feeding a sheet onto the web at said stationary location such that a leading edge of the sheet aligns with said second length as defined along the web.

20. Apparatus for measuring a series of predetermined lengths along a web moving past a stationary location, to enable registered positioning of at least one repetitive operation on the web in accordance with said predetermined lengths, said apparatus for use with a device for operating rotation synchronously with advance of the web past said stationary location, said apparatus comprising:
means for generating a data signal in response to rotation of said element, said data signal including a series of count pulses, each of said pulses corresponding to identical increments of rotation;
means for storing data;
processing means connected to said data signal generating means and to said data storing means for converting a first of said increments, adjusting said first real number to an adjacent first integer number of said increments, determining a first error amount resulting from said adjusting, and storing said first error amount in said data storing means;
said processing means further receiving said data signal and defining a first of said lengths long the web upon sufficient advance of the web past said stationary location to cause generation of said data signal to include a number of said count pulses equal to said first number;

said processing means being further for converting a second of said predetermined lengths to a second real number of said increments, adjusting said second real number to an adjacent second integer number of said increments, determining a second error amount resulting from said adjusting, retrieving from said data storing means and adding to said second error amount said first error amount to produce a cumulative error amount, incrementing said second integer number in the event said cumulative error exceeds one to an adjacent corrected second integer number and decreasing said cumulative error amount by one, and storing said cumulative error amount in said data storing means;

said processing means further receiving said data signal and defining a second of said lengths along the web upon sufficient advance of the web past said stationary location to cause generation of said data signal to include a number of said count pulses equal to said corrected second integer number.

21. Apparatus as defined in claim 20, wherein said processing means performs said adjusting by truncating said first real number and said second corrected real number to said first integer number and said second integer number, respectively, and wherein said first and second error amounts are residues from said truncating.

22. Apparatus as defined in claim 20 wherein said processing means performs said adjusting by rounding said first real number and said second corrected real number to said first integer number and said second integer number, respectively, and wherein said first and second error amounts result from said rounding.

23. Apparatus as defined in claim 21, wherein said data signal generating means is a rotational positional encoder connected for rotation to said element.

24. Apparatus as defined in claim 23, wherein said encoder is constructed to define identical increments of rotation, each corresponding to web movement of an incremental length of less precision than the precision of said predetermined lengths.

25. Apparatus as defined in claim 20 further comprising operator input means for providing to said processing means the predetermined lengths along the web.

26. Apparatus for measuring a series of predetermined lengths along a web moving past a stationary location, to enable registered positioning of at least one repetitive operation on the web in accordance with said predetermined lengths, said apparatus for use with a device for operating on the web, which device includes an element rotating synchronously with advance of the web past said stationary location, said apparatus comprising:

means for generating a data signal in response to rotation of said element, said data signal including a series of count pulses, each of said pulses corresponding to identical increments of rotation;

means for storing data;

processing means connected to said data signal generating means and to said data storing means for converting a first of said predetermined lengths to a first real number of said increments, adjusting said first real number to an adjacent first integer number of said data storing means;

said processing means further receiving said data signal and defining a first of said lengths along the web upon sufficient advance of the web past said stationary location to cause generation of said data signal to include a number of said count pulses equal to said first number;

said processing means being further for converting a second of said predetermined lengths to a second real number of said increments, retrieving from said data storing means and adding to said second real number said first error amount to produce a second corrected real number of said increments, adjusting said second corrected real number to a second integer number of said increments, determining a second error amount resulting from said adjusting, and storing said second error amount in said data storing means;

said processing means further receiving said data signal and defining a second of said lengths along the web upon sufficient advance of the web past said stationary location to cause generation of said data signal to include a number of said count pulses equal to said second number.

27. Apparatus for positioning sheets fed from a sheet supply onto a moving web in registration with predetermined nominal lengths along the web, said apparatus for use with a device for operating on the web, which device includes an element rotating synchronously with advance of the web past a stationary location, said apparatus comprising:

means for generating a data signal in response to rotation of said element, said data signal including a series of count pulses, each of said pulses corresponding to identical increments of rotation;

means for storing data;

processing means connected to said data signal generating means and to said data storing means for converting a first of said predetermined lengths to a first real number of said increments, adjusting said first real number to an adjacent first integer number of said increments, determining a first error amount resulting from said adjusting, and storing said first error amount in said data storing means;

said processing means further receiving said data signal and defining a first of said lengths along the web upon sufficient advance of the web past said stationary location to cause generation of said data signal to include a number of said count pulses equal to said first number;

feed means for feeding a sheet onto the web at said stationary location in response to said processing means such that a leading edge of the sheet aligns with said first length as defined along the web;

said processing means being further for converting a second of said predetermined lengths to a second real number to an adjacent second integer number of said increments, determining a second error amount resulting from said adjusting, retrieving from said data storing means and adding to said second error amount said first error amount to produce a cumulative error amount, incrementing said second integer number in the event said cumulative error exceeds one to an adjacent corrected second integer number and decreasing said cumulative error amount in said data storing means, said processing means further receiving said data signal and defining a second of said lengths along the web upon sufficient advance of the web past said stationary location to cause generation of said data signal to include a number of said count pulses equal to said corrected second integer number;

said feed means further feeding a sheet onto the web at said stationary location in response to said processing means such that a leading edge of the sheet aligns with said second length as defined along the web.

28. Apparatus as defined in claim 27, wherein said processing means performs said adjusting by truncating said first real number and said second corrected real number to said first integer number and said second integer number, respectively, and wherein said first and second error amounts are residues from said truncating.

29. Apparatus as defined in claim 27, wherein said processing means performs said adjusting by rounding said first real number and said second corrected real number to said first integer number and said second integer number, respectively, and wherein said first and second error amounts result from said rounding.

30. Apparatus as defined in claim 27, wherein said data signal generating means is a rotational positional encoder connected for rotation to said element.

31. Apparatus as defined in claim 30, wherein said encoder is constructed to define identical increments of rotation, each corresponding to web movement of an incremental length of less precision than the precision of said predetermined lengths.

32. Apparatus as defined in claim 27, further comprising operator input means for providing to said processing means the predetermined lengths along the web.

33. Apparatus for positioning sheets fed from a sheet supply onto a moving web in registration with predetermined nominal lengths along the web, said apparatus for use with a device for operating on the web, which device includes an element rotating synchronously with advance of the web past a stationary location, said apparatus comprising:

means for generating a data signal in response to rotation of said element, said data signal including a series of count pulses, each said pulse corresponding to a predetermined increment of rotation;
means for storing data;
processing means connecting to said data signal generating means and to said data storing means for converting a first of said predetermined lengths to a first real number of said increments, adjusting said first real number to an adjacent first integer number of said increments, determining a first error amount resulting from said adjusting, and storing said first error amount in said data storing means;
said processing means further receiving said data signal and defining a first of said lengths along the web upon sufficient advance of the web past said stationary location to cause generation of said data signal to include a number of said count pulses equal to said first number;
feed means for feeding a sheet onto the web at said stationary location in response to said processing means such that a leading edge of the sheet aligns with said first length as defined along the web;
said processing means being further for converting a second of said predetermined lengths to a second real number of said increments, retrieving from said data storing means and adding to said second real number said first error amount to produce a second corrected real number of said increments, adjusting said second corrected real number to an adjacent second integer number of said increments, determining a second error amount resulting from said adjusting, and storing said second error amount in said data storing means;
said processing means further receiving said data signal and defining a second of said lengths along the web upon sufficient advance of the web past said stationary location to cause generation of said data signal to include a number of said count pulses equal to said second integer number;
said feed means further feeding a sheet onto the web at said stationary location in response to said processing means such that a leading edge of the sheet aligns with said second length as defined along the web.

* * * * *